Charles O. Parsons
INVENTOR.

BY Clarence A. O'Brien and Harvey B. Jacobson
Attorneys

Oct. 6, 1959 C. O. PARSONS 2,907,925

PRINTED CIRCUIT TECHNIQUES

Filed Sept. 29, 1955 2 Sheets-Sheet 2

Charles O. Parsons
INVENTOR.

BY Clarence A. O'Brien
and Harvey B. Jacobson
Attorneys

United States Patent Office 2,907,925
Patented Oct. 6, 1959

2,907,925

PRINTED CIRCUIT TECHNIQUES

Charles O. Parsons, Roswell, N. Mex.; Gertrude M. Parsons, executrix of the estate of said Charles O. Parsons, deceased, assignor of one-half to Gertrude M. Parsons, Roswell, N. Mex.

Application September 29, 1955, Serial No. 537,404

2 Claims. (Cl. 317—101)

This invention relates to improvements in printed circuit techniques, and more particularly, to novel means for forming suitable electrical and electronic circuits utilizing laminated sections having conductors and circuit components disposed thereon and arranged to provide electrostatic and electromagnetic shielding for the electrical components of the circuit.

In an electronic device whose components are closely spaced, it is usually necessary to route printed wiring on a plane surface in a manner that results in unnecessary long and roundabout routes which contribute to instability of the completed circuit by introducing feed-back loops due to parallel wiring, excessively long leads or distributed capacities between wiring, thus reducing the efficiency of the circuit or making it unstable. It is therefore the primary object of the present invention to provide means for overcoming the limitations in the prior art printed circuits by employing a multiple section system of printing which employs laminates of an insulating material of good insulative qualities having aligned apertures therethrough with the apertures in each section being coated throughout on each side of the holes for a small distance radially outwardly therefrom with a conductive material to assure a good contact between the aligned apertures in the adjacent sections on each side.

A further object of the invention resides in the provision of a printed circuit construction having aligned apertures in the various sections with electrically conductive material coating the surfaces formed by the apertures so as to assure a good contact with conductive lead wires which may be mounted and dip soldered into the apertures.

Still further objects and features of this invention reside in the provision of improved printed circuit techniques which enable the electrical and electronic devices and circuits to be manufactured at a comparatively low cost and while being adapted to occupy a minimum amount of space.

These, together with the various ancillary objects and features of the invention which will become apparent as the following description proceeds, are attained by these improved printed circuits comprising the present invention, preferred embodiments of which have been illustrated in the accompanying drawings, by way of example only, wherein.

Figure 1:
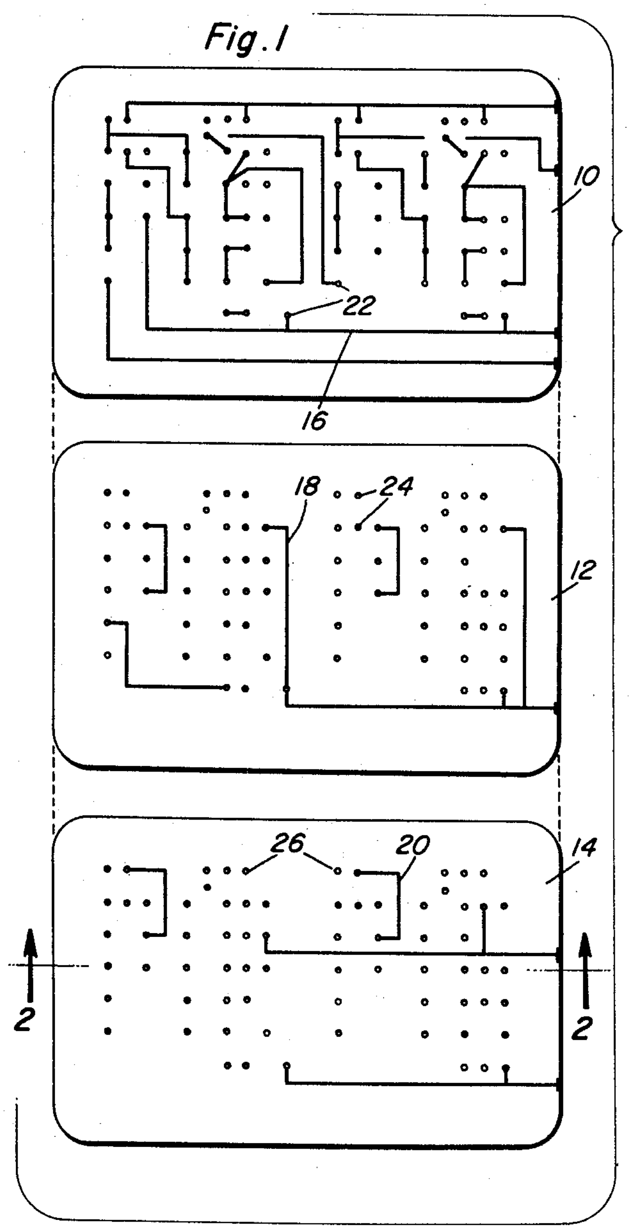
Figure 1 is an exploded view of a printed circuit arrangement employing the techniques of the present invention.
Figure 2:
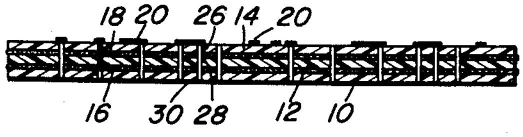
Figure 2 is a vertical sectional detail view as taken along the plane of line 2—2 in Figure 1.

With continuing reference to the accompanying drawings wherein like reference numerals designate similar parts throughout the various views, reference numerals 10, 12 and 14, see Figure 1, are used to generally designate suitable sections of the multi-layer printed circuit employing the concepts of the present invention. It is to be recognized that two or more sections may be utilized in the construction of an electrical or electronic device in accordance with this invention.

The sections 10, 12 and 14 are formed of comparatively thin plates of an insulating material, such as is used conventionally in the formation of individual printed components, and may be conventional copper-clad laminates.

Thus, the sections 10, 12 and 14 are provided with suitable electrical componets and partial circuit conductors printed thereon, as at 16, 18 and 20 as a result of the printing, etching or embossing methods, as are conventionally utilized.

Figure 3:
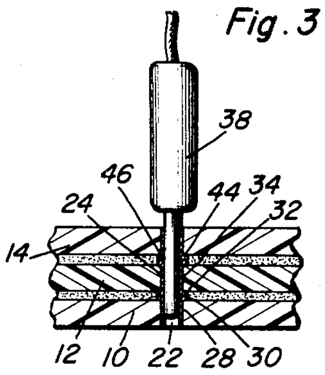
Figure 3 is an enlarged sectional detail view illustrating the manner in which a conductor can be positioned in the aligned apertures in the sections.
Figure 4:
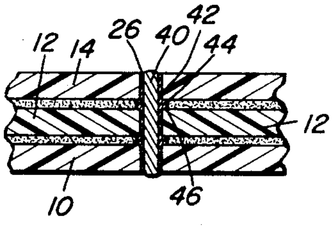
Figure 4 is another enlarged sectional detail view illustrating the manner in which the aligned conductive coated apertures can be filled with a multiple conductive material, such as solder, for further ensuring proper contact.

A plurality of apertures, as are indicated at 22, 24 and 26, are drilled in the sections 10, 12 and 14 with each of the apertures of the groups of the apertures 22, 24 and 26 being in alignment with the apertures of the other groups. As can be seen best in Figures 3 and 4, a conductive coating, as at 28, is provided about the bore of the apertures 22 in the section 10 while the coating 28 extends radially outwardly along the surface of the aperture for a predetermined extent, as at 30, to provide contact with the conductive coating 32 which extends outwardly along the face of the section 12 and is a continuation of the conductor 34 about the bores formed by the apertures 24.

It is to be noted that a conductive terminal or conductor 38 may be inserted into any one of the sets of aligned apertures and may be dip soldered in position with the meltable material forming the solder being of a conductive nature. Likewise, a meltable conductive material 40 can be positioned in the aligned apertures using dip soldering techniques, as may be desired. It is to be noted that the section 14 is provided with a coating as at 42 about the bore of the plate formed by the apertures 26 and that the coating extends radially outwardly, as at 44, to contact the radially outwardly extending coating 46 of the section 12.

Referring now to the arrangement of parts as is shown in Figures 5 through 8, it will be noted that herein the invention is discolsed as including a plurality of concentric tubes of a suitable insulatng material, as at 50, 52, 54, 56 or 58. Any suitable number of these tubes may be utilized, and by means of printing, embossing or etching, as is conventional suitable electrical components and partial circuits may be provided on a surface of each of the tubes. These electrical components and conductors are indicated generally at 60, 62, 64, etc.

Also formed by any suitable means, such as punching. drilling or the like in the tubes 50, 52, 54, 56 and 58 are apertures 66, 68, 70, 72 and 74 which are arranged in sets in alignment with each other. The tubes 50, 52, etc., are provided with conductive coatings on the surfaces of the apertures which coat the bores formed by the apertures 66, 68, etc., and extend radially outwardly from the apertures on the inner and outer faces of the tubes. These coatings are generally indicated at 76, 78, 80, etc. The coatings are arranged so as to contact with each other and also complete operative electrical circuits between the electrical components 60, 62, 64, etc., printed on the various sections or tubes.

Figures 5, 6, 7, 8:
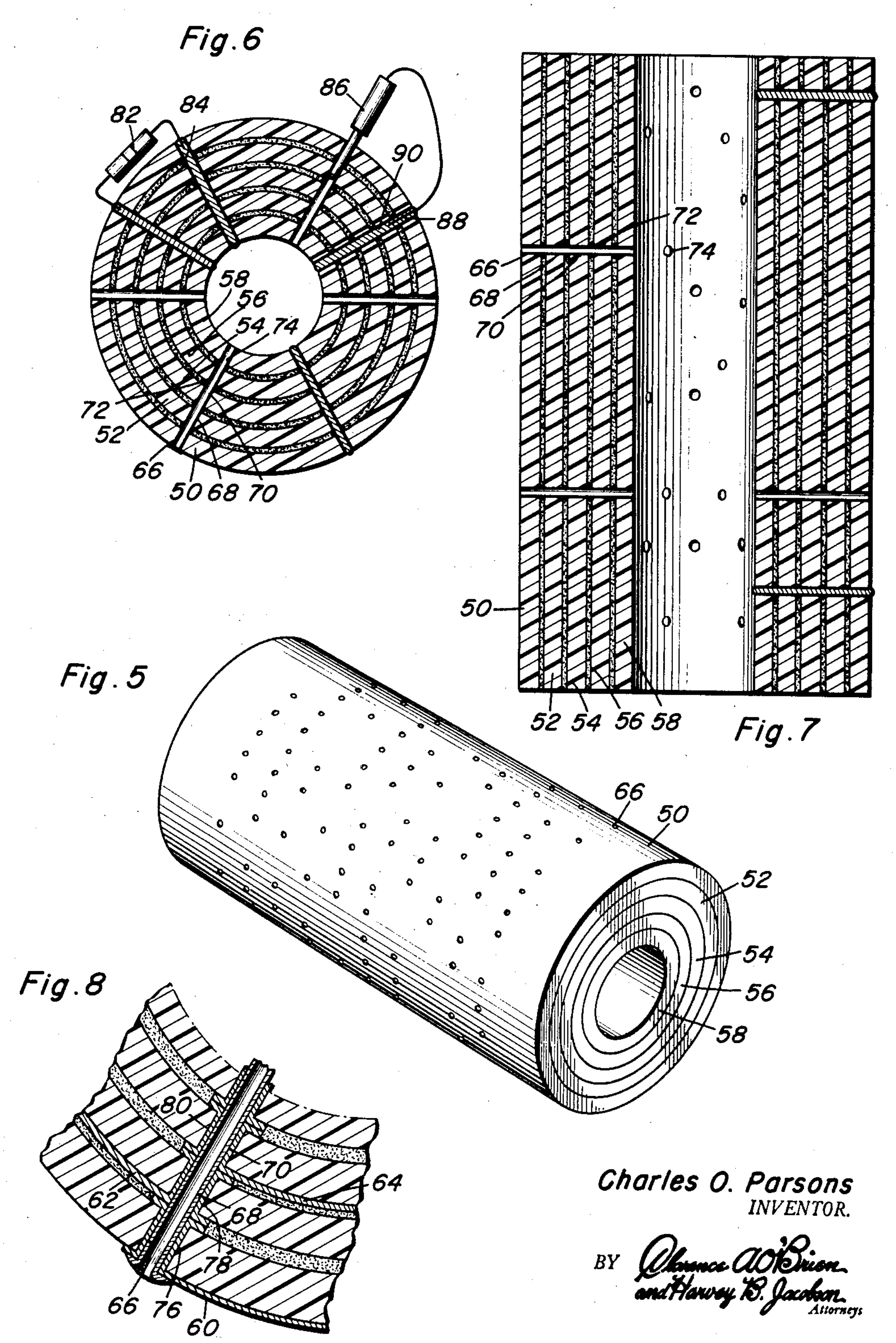
Figure 5 is a perspective view of a modified form of the invention employing concentric tubular laminates.
Figure 6 is an enlarged transverse sectional view of an electrical device employing the concepts of the present invention and employing the concentric tubular laminates.
Figure 7 is a longitudinal sectional view of the tubular laminate printed circuit arrangement.
Figure 8 is an enlarged sectional detail view illustrating the manner in which conductive terminals can be inserted in the aligned apertures of the tubular laminates.

As can be seen in Figures 6, various electrical components, such as condensers 82, can be secured in position by being dip soldered, as at 84, the solder also aiding in the completion of the electrical circuits by its conductve nature. Further, suitable conductors, as at 86, forming terminals may be secured in the aligned apertures, as may conductors, as at 88, which can be dip soldered, as at 90.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention as claimed.

What is claimed as new is as follows:

1. A printed circuit construction comprising a plurality of sections forming a laminate of insulatve materal, each of said sections having electrical circuit conductors adhered thereon, said sections each having a series of apertures therethrough with the apertures through the respective sections being in alignment with each other, conductive coatings on said sections covering the side walls of the bores formed by said apertures with said coatings extending radially outwardly from said apertures on the faces of said sections within the laminate, the coatings about said apertures on the face of one of said sections contacting the coatings about the apertures on the adjacent face of an adjacent section, said sections being comparatively thin sheets of an insulating material, conductors received in said aligned apertures, and a meltable conductive material bonding the last-mentioned conductors to said conductive coatings.

2. A printed circuit construction comprising a plurality of sections forming a laminate of insulative material, each of said sections having electrical circuit conductors adhered thereon, said sections each having a series of apertures therethrough, with the apertures through the respective sections being in alignment with each other, conductive coatings on said sections covering the walls of the bores formed by said apertures with said coatings extending radially outwardly from said apertures on the faces of said sections within the laminate, the coatings about said apertures on the face of one of said sections contacting the coating about the apertures on the adjacent face of an adjacent section, said sections being comparatively thin concentrically disposed tubes of insulating material, conductors received in said aligned apertures, and a meltable conductive material bonding the last-mentioned conductors to said conductive coatings.

References Cited in the file of this patent

UNITED STATES PATENTS

| | | |
|---|---|---|
| 2,433,384 | McLarn | Dec. 30, 1947 |
| 2,474,988 | Sargrove | July 5, 1949 |
| 2,481,951 | Sabee | Sept. 13, 1949 |
| 2,502,291 | Taylor | Mar. 28, 1950 |
| 2,700,150 | Wales | Jan. 18, 1955 |